(12) United States Patent
de Frésart et al.

(10) Patent No.: US 6,747,332 B2
(45) Date of Patent: Jun. 8, 2004

(54) SEMICONDUCTOR COMPONENT HAVING HIGH VOLTAGE MOSFET AND METHOD OF MANUFACTURE

(75) Inventors: Edouard de Frésart, Tempe, AZ (US); Patrice Parris, Phoenix, AZ (US); Pak Tam, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 32 days.

(21) Appl. No.: 10/114,784

(22) Filed: Apr. 1, 2002

(65) Prior Publication Data

US 2003/0183899 A1 Oct. 2, 2003

(51) Int. Cl.[7] ............................................... H01L 29/00
(52) U.S. Cl. ...................... 257/500; 257/288; 257/409; 438/218; 438/294
(58) Field of Search ................. 257/288, 409, 257/500, 503–506; 438/207, 218, 219, 294, 427

(56) References Cited

U.S. PATENT DOCUMENTS 5,475,335 A * 12/1995 Merrill et al. ............ 327/536
5,885,876 A * 3/1999 Dennen ..................... 438/294

* cited by examiner

Primary Examiner—Nathan J. Flynn
Assistant Examiner—Scott R. Wilson
(74) Attorney, Agent, or Firm—Bryan Cave LLP (57) ABSTRACT

A semiconductor component includes a semiconductor substrate (310) having a first conductivity type, a first semiconductor device (320) at least in a first portion of the semiconductor substrate, and a second semiconductor device (330, 310) at least in a second portion of the semiconductor substrate. The first semiconductor device includes a first electrode region (321), a second electrode region (322), a body region (323), and an isolation region (324) in the first portion of the semiconductor substrate. The body region has the first conductivity type, and the first electrode region, the second electrode region, and the isolation region have a second conductivity type. The second electrode region has a different doping concentration than the first electrode region, and the body region is isolated from the second portion of the semiconductor substrate by the isolation region and the first electrode region.

27 Claims, 2 Drawing Sheets

SEMICONDUCTOR COMPONENT HAVING HIGH VOLTAGE MOSFET AND METHOD OF MANUFACTURE

FIELD OF THE INVENTION

This invention relates to electronics, in general, and to semiconductor components and methods of manufacture, in particular.

BACKGROUND OF THE INVENTION

In applications such as Liquid Crystal Display (LCD) display drivers, the source, body, gate, and drain terminals of a Metal-Oxide-Semiconductor Field Effect Transistor (MOSFET) must be able to sustain high voltages of fifteen volts or greater relative to each other and relative to the semiconductor substrate in which the MOSFET is formed. One skilled in the art will understand that FIG. 1. illustrates a cross-sectional view of a MOSFET 100 that is suitable for high voltage applications involving voltages greater than approximately fifteen volts. MOSFET 100 is manufactured using an older semiconductor technology that uses a semiconductor substrate 110 that does not include an epitaxial layer. Semiconductor substrate 110 has an P-type conductivity with a low doping concentration referred to as P−.

Figure 1:
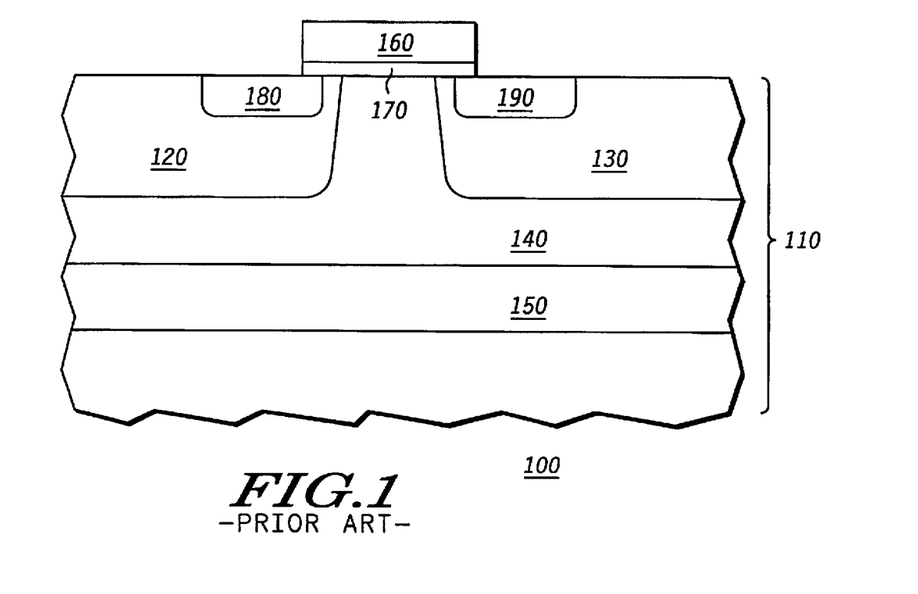
FIG. 1 illustrates a cross-sectional view of a MOSFET in accordance with the prior art.

MOSFET 100 is bi-directional and symmetric and is an N-type MOSFET or NMOS transistor. One skilled in the art will understand that appropriate changes can be made to the description of MOSFET 100 if MOSFET 100 were a P-type MOSFET or PMOS transistor. MOSFET 100 includes a gate electrode 160, a gate oxide 170, and field oxide regions 180 and 190. MOSFET 100 also includes four deep diffused wells 120, 130, 140, and 150 to isolate MOSFET 100 from other transistors in semiconductor substrate 110. Wells 120, 130, and 150 have an N-type conductivity, and well 140 has a P-type conductivity. The deep-diffused wells, however, are not compatible with modern deep sub-micron device technologies because of the imprecision of the diffusion process.

Figure 2:
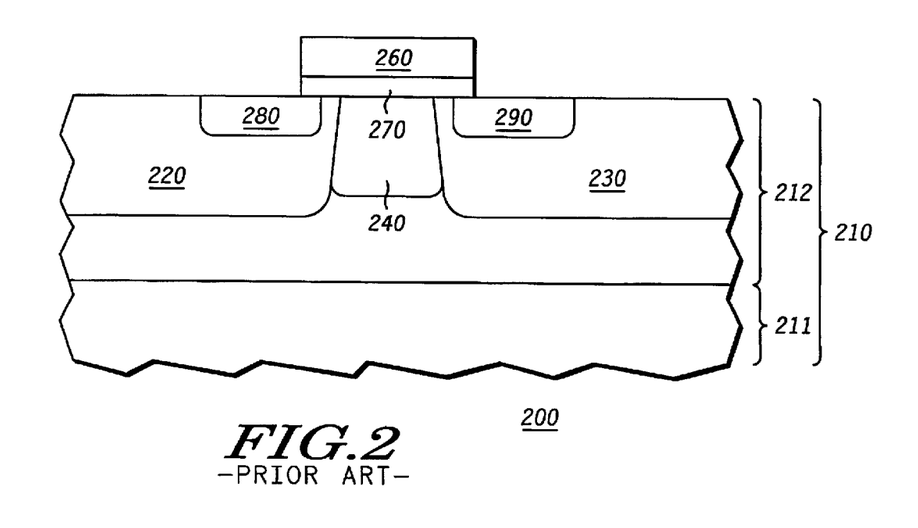
FIG. 2 illustrates a cross-sectional view of another MOSFET in accordance with the prior art.

One skilled in the art will understand that FIG. 2 illustrates a cross-sectional view of a MOSFET 200 that is also suitable for high voltage applications. MOSFET 200 is manufactured using a more modern deep-submicron semiconductor technology that uses a semiconductor substrate 210 that includes a support substrate 211 and an epitaxial layer 212. Support substrate 211 has a P-type conductivity and has a very high doping concentration referred to as P+ to minimize a latch-up problem during operation of MOSFET 200. Epitaxial layer 212 has a P− conductivity.

MOSFET 200 is bi-directional and symmetric and is an N-type MOSFET or NMOS transistor. One skilled in the art will understand that appropriate changes can be made to the description of MOSFET 200 if MOSFET 200 were a P-type MOSFET or PMOS transistor. MOSFET 200 includes a gate electrode 260 and field oxide regions 280 and 290. MOSFET 200 is formed in epitaxial layer 212, but epitaxial layer 212 is too thin to contain the multiple deep diffused wells described earlier for the older semiconductor technology in FIG. 1. Instead, MOSFET 200 in FIG. 2 includes more shallow N-type conductivity wells 220 and 230.

To permit MOSFET 200 to operate under high voltage conditions, MOSFET 200 typically includes an extra P-type region 240. MOSFET 200 also typically includes a gate oxide 270 that is thicker than that required for gate oxide 170 of MOSFET 100 in FIG. 1 to provide the high voltage compatibility for MOSFET 200 in FIG. 2. Gate oxide 270 may require a thickness of approximately forty nanometers in order to support a twelve volt breakdown voltage.

This thicker gate oxide, however, is approximately four times the thickness of gate oxides for typical MOSFETs. Therefore, a new process module must be inserted into the manufacturing process to be able to integrate MOSFET 200 into an integrated circuit with other MOSFETs. This new process module increases the cost, complexity, and cycle time for the manufacturing process of the semiconductor component containing MOSFET 200.

The thicker gate oxide also requires a larger gate-to-source operating voltage, approximately twelve volts, to fully drive MOSFET 200. Therefore, a higher voltage power supply must also be used for the integrated circuit containing MOSFET 200. This higher voltage power supply increases the application costs and also decreases the application convenience for MOSFET 200.

Furthermore, the channel region underneath the thicker gate oxide in MOSFET 200 is not isolated from, but is electrically shorted to, other portions of semiconductor substrate 210 such as support substrate 211. Therefore, the electrical performance of MOSFET 200 will be degraded by the other devices in semiconductor substrate 210. Additionally, at least the gate terminal of MOSFET 200 may not be capable of sustaining high voltages of fifteen volts or greater relative to support substrate 211.

Accordingly, a need exists for a semiconductor component suitable for use in high voltage applications, particularly where a semiconductor device in the semiconductor component has electrodes that are capable of sustaining high voltages relative to each other. A need also exists for a method of manufacturing the semiconductor component.

BRIEF DESCRIPTION OF THE DRAWINGS

The invention will be better understood from a reading of the following detailed description, taken in conjunction with the accompanying figures in the drawings in which.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale. For example, the dimensions of some of the elements in the figures may be exaggerated relative to other elements to help to improve understanding of embodiments of the present invention. Furthermore, the same reference numerals in different figures denote the same elements.

Furthermore, the terms first, second, third, fourth, and the like in the description and in the claims, if any, are used for distinguishing between similar elements and not necessarily for describing a sequential or chronological order. It is further understood that the terms so used are interchangeable under appropriate circumstances such that the embodiments of the invention described herein are, for example, capable of operation in other sequences than illustrated or otherwise described herein.

Moreover, the terms over, under, and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than illustrated or otherwise described herein.

DETAILED DESCRIPTION OF THE DRAWINGS

Figure 3:
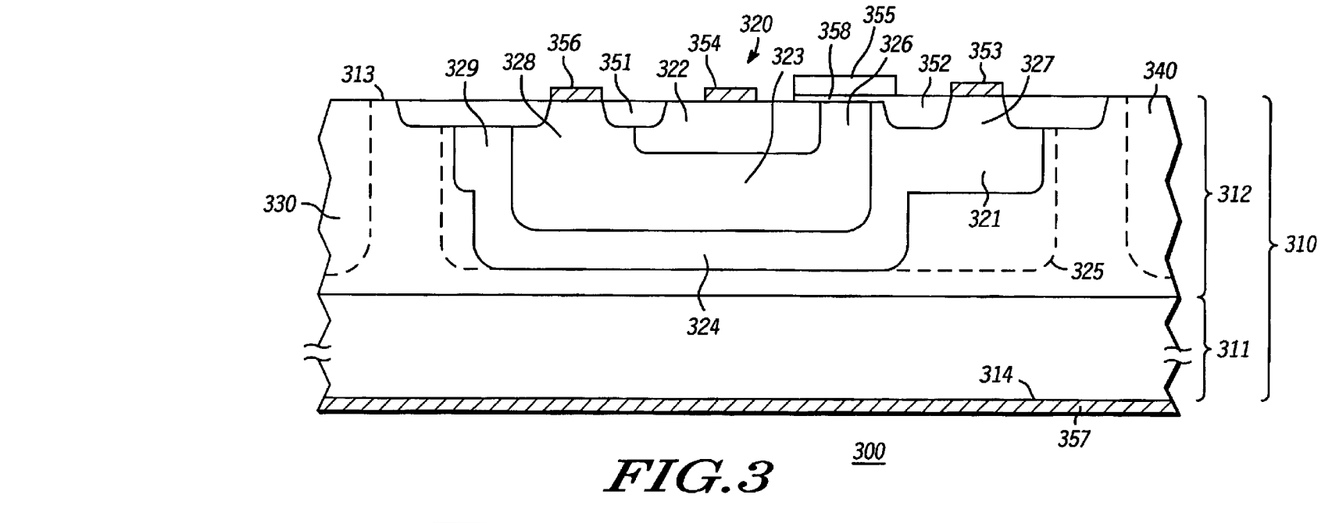
FIG. 3 illustrates a cross-sectional view of a semiconductor component in accordance with an embodiment of the invention.

FIG. 3 illustrates a cross-sectional view of a semiconductor component 300. Semiconductor component 300 comprises a semiconductor device 320. As an example, semiconductor device 320 can be a transistor such as, for example, a MOSFET.

Semiconductor device 320 is compatible with high voltage applications such that each of the electrodes of semiconductor device 320 is capable of sustaining high voltages relative to each other, regardless of the polarity between the electrodes. For example, when semiconductor device 320 is a MOSFET, semiconductor device 320 can have a conventional gate oxide thickness of approximately twenty nanometers, which is commonly used in typical high voltage MOSFETs and flash or memory devices. Semiconductor device 320 can sustain high gate voltages by isolating the channel region of the device from the substrate by using an isolation region located between the channel region and the rest of the substrate. Semiconductor device 320 can also sustain high drain voltages by using (a) a drift structure in combination with a trench or other isolation region or (b) an active drift region. Semiconductor device 320 can further sustain high source voltages by using the same techniques.

Moreover, only one of the source and drain regions of semiconductor device 320 or both can employ resurf techniques to maximize or at least increase the breakdown voltages for a given drain-to-source on resistance and area. Lower breakdown voltages can be obtained using higher doping concentrations in the source and drain regions while improving or increasing the magnitude of the saturated drain current, reducing the drain-to-source on resistance, and reducing the area. Semiconductor device 320 will be described in more detail hereinafter.

Semiconductor component 300 also comprises a semiconductor substrate 310. As an example, semiconductor substrate 310 has a first conductivity type and can comprise a support substrate 311 and an epitaxial layer 312 over support substrate 311. As an example, support substrate 311 can be a monocrystalline substrate, and epitaxial layer 312 can have a thickness of approximately two to four micrometers. Semiconductor substrate 310 has a surface 313 and a surface 314 opposite surface 313. In a different embodiment, semiconductor substrate 310 can be devoid of epitaxial layer 312.

Semiconductor component 300 further comprises semiconductor devices 330 and 340, which are designated by dotted lines in FIG. 3. Semiconductor device 330 is in a different portion of epitaxial layer 312 of semiconductor substrate 310 from semiconductor device 340, and semiconductor devices 330 and 340 are each in different portions of epitaxial layer 312 of semiconductor substrate 310 from semiconductor device 320. As an example, semiconductor devices 330 and 340 can be transistors, resistors, capacitors, inductors, or the like. In one embodiment, semiconductor devices 330 and 340 are transistors such as, for example, bipolar transistors or field effect transistors such as, for example, MOSFETs or MEtal-Semiconductor FETs (MESFETs). Semiconductor devices 330 and 340 can be the same or different devices. Accordingly, semiconductor devices 330 and 340 can have many different structures. Therefore, the depiction of semiconductor devices 330 and 340 are only for the purpose of illustration.

Returning to semiconductor device 320, semiconductor device 320 is in a portion of epitaxial layer 312 of semiconductor substrate 310. Semiconductor device 320 comprises an electrode region 321, an electrode region 322, a body region 323, and an isolation region 324. As an example, electrode region 321, electrode region 322, body region 323, and isolation region 324 are located in epitaxial layer 312. In one embodiment, electrode region 321, electrode region 322, body region 323, and isolation region 324 are located only in epitaxial layer 312 and are not located in support substrate 311. In this embodiment, a portion of epitaxial layer 312 is located between isolation region 324 and support substrate 311. Also in this embodiment, electrode region 321 extends across a portion of epitaxial layer 312 and includes a portion 329.

In the embodiment of semiconductor device 320 illustrated by the solid lines in FIG. 3, isolation region 324 is absent underneath a portion of electrode region 321. In this embodiment, support substrate 311 has a higher doping concentration of greater than or equal to approximately $1 \times 10^{18}$ atoms per centimeter cubed. Also in this embodiment, a portion of epitaxial layer 312 is located between support substrate 311 and isolation region 324, electrode region 321, electrode region 322, and body region 323. In a different embodiment, isolation region 324 is illustrated by dashed line 325 and is located underneath substantially all of electrode region 321, electrode region 322, and body region 323. In this different embodiment, support substrate 311 has a lower doping concentration of less than or equal to approximately $1 \times 10^{15}$ atoms per centimeter cubed. Also in this embodiment, isolation region 324 can extend from epitaxial layer 312 into support substrate 311.

Electrode region 321, electrode region 322, and isolation region 324 can have a first conductivity type, and body region 323 can have a second conductivity type. As an example, the first conductivity type can be N-type, and the second conductivity type can be P-type.

Furthermore, electrode region 321 and electrode region 322 can have different doping concentrations. For example, electrode region 321 and electrode region 322 can each be comprised of a heavily doped region and a lightly doped region, which are not separately illustrated in FIG. 3 in order to depict semiconductor component 300 more clearly. The lightly doped region of each of electrode region 321 and electrode region 322 can have different doping concentrations in semiconductor substrate 310, different lateral widths across semiconductor substrate 310, and different vertical depths from surface 313 into semiconductor substrate 310. As an example, electrode region 321 can be a drain region, and electrode region 322 can be a source region. Furthermore, the lightly doped region within electrode region 321 can be a resurf region; the doping concentration for the lightly doped region in electrode region 321 can be higher than that of the lightly doped region in electrode region 322; and the width and depth of the lightly doped region in electrode region 321 can be wider and deeper, respectively, than that of the lightly doped region in electrode region 322. Accordingly, the lightly doped regions in electrode region 321 and electrode region 322 can be asymmetric with each other. In a different embodiment, one of electrode region 321 and electrode region 322 can be comprised only of a heavily doped region and can be devoid of a lightly doped region.

Electrode region 322 is adjacent to body region 323 and is isolated from electrode region 321, isolation region 324, semiconductor devices 330 and 340, and other portions of semiconductor substrate 310 by body region 323. In the embodiment illustrated in FIG. 3, electrode region 322 is contiguous with body region 323.

In the same or a different embodiment, body region 323 can be adjacent to and even contiguous with electrode region 321 and isolation region 324. Furthermore, electrode region 321 and isolation region 324 can be coupled to each other. In particular, electrode region 321 and isolation region 324 can be contiguous with each other. Accordingly, body region 323 can be isolated from semiconductor devices 330 and 340 and from other portions of semiconductor substrate 310 by electrode region 321 and isolation region 324.

In the embodiment illustrated in FIG. 3, a portion 326 of body region 323 can be the channel region for semiconductor device 320 and can be located between electrode region 322 and a portion 327 of electrode region 321. Furthermore, electrode region 322 can be located between portion 326 of body region 323 and a portion 328 of body region 323, and portion 328 of body region 323 can be located between electrode region 322 and portion 329 of electrode region 321. As an example, portion 326 of body region 323 can have a sub-micrometer length as measured from the edge of body region 323 to the edge of electrode region 322.

As illustrated in FIG. 3, semiconductor device 320 can additionally comprise a dielectric isolation region 351 at least partially located in a portion of epitaxial layer 312 located between portion 328 of body region 323 and electrode region 322. In the same or different embodiment, semiconductor device 320 can further comprise a dielectric isolation region 352 at least partially located in a portion of epitaxial layer 312 located between portion 327 of electrode region 321 and portion 326 of body region 323. As an example, dielectric isolation regions 351 and 352 can be LOCal Oxidation of Silicon (LOCOS) regions or other Field OXide (FOX) regions, trench isolation regions, or the like.

Also illustrated in FIG. 3, semiconductor device 320 can still further comprise electrodes 353, 354, 355, 356, and 357. As an example, electrode 353 can be located over portion 327 of electrode region 321; electrode 354 can be located over electrode region 322; electrode 355 can be located over portion 326 of body region 323; electrode 356 can be located over portion 328 of body region 323; and electrode 357 can be located under isolation region 324, electrode region 321, and electrode region 322. Electrode 353, 354, 355, and 356 can be located adjacent to surface 313 of semiconductor substrate 310, and electrode 357 can be located adjacent to surface 314 of semiconductor substrate 310. As an example, electrodes 353, 354, 355, 356, and 357 can be independent of each other and can represent the drain, source, gate, body, and substrate electrodes, respectively, for semiconductor device 320. In an embodiment where semiconductor device 320 is a bi-directional device, then electrodes 353 and 354 can switch from being the drain and source electrodes, respectively, to being the source and drain electrodes, respectively.

A dielectric layer 358 can be located between surface 313 of semiconductor substrate 310 and electrode 355. As an example, dielectric layer 358 can be comprised of silicon dioxide and have a thickness of approximately twenty nanometers. In the embodiment where electrode 355 is the gate electrode, dielectric layer 358 can be a gate oxide layer.

In one embodiment when semiconductor device 320 is a FET under certain operating conditions, electrode 353 is a drain electrode, and electrode 354 is a source electrode. In the same or different embodiment when semiconductor device 320 is a FET under different operating conditions, electrode 353 is a source electrode, and electrode 354 is a drain electrode. Furthermore, in the same or different embodiment, electrodes 354 and 356 can be electrically shorted together or can be a single electrode.

As described above and as illustrated in FIG. 3, semiconductor device 320 is an asymmetrical device and can also be a bi-directional device. The layout of semiconductor device 320 permits the electrodes and electrode regions of semiconductor device 320 to have high breakdown voltages. For example, semiconductor device 320 can remain operational when electrode region 322 is reverse biased relative to body region 323. Computer simulation results for semiconductor device 320 have shown high saturated drain currents at relatively low gate fields, low drain-to-source on resistances, and high drain-to-source breakdown voltages.

The high gate-to-body (and vice versa) breakdown voltage is provided mainly by adjusting the thickness and quality of dielectric layer 358; the high source-to-body (and vice versa) breakdown voltage is provided mainly by adjusting the various doping levels of body region 323 and electrode region 322 and also by adjusting the spacing between the heavily doped portions of body region 323 and electrode region 322; and the high drain-to-body (and vice versa) breakdown voltage is provided mainly by adjusting the spacing between the heavily doped portions of body region 323 and electrode region 321 and also by adjusting the doping concentrations and shape of the various doped portions of electrode region 321, as well as by adjusting the length of dielectric region 352.

Additionally, the high drain-to-gate (and vice versa) breakdown voltage is provided mainly by adjusting the spacing between the heavily doped portion of electrode region 321 and portion 326 of body region 323, by adjusting the doping concentration and shape of the various doped portions of electrode region 321, and also by adjusting the trench field drift structure formed by dielectric isolation region 352 and the lightly doped region of electrode region 321; and the high source-to-gate (and vice versa) breakdown voltage is provided mainly by adjusting the doping concentration and shape of the various doped portions of electrode region 322 and also by adjusting the spacing between the heavily doped portion of electrode region 322 and portion 326 of body region 323.

Furthermore, the high drain-to-substrate (and vice versa) breakdown voltage is provided mainly by adjusting the junction depth of electrode region 321 and isolation region 324 into epitaxial layer 312, by adjusting the thickness of epitaxial layer 312, and also by adjusting the relative doping concentrations between support substrate 311 and the lightly doped portion of electrode region 321, and also between support substrate 311 and isolation region 324; the high body-to-substrate (and vice versa) breakdown voltage is provided mainly by adjusting the relative doping concentration between support substrate 311 and isolation region 324; the high gate-to-substrate (and vice versa) breakdown voltage is limited mainly by adjusting the body-to-substrate breakdown voltage; and the high source-to-substrate (and vice versa) breakdown voltage is also limited mainly by adjusting the body-to-substrate breakdown voltage.

Figure 4:
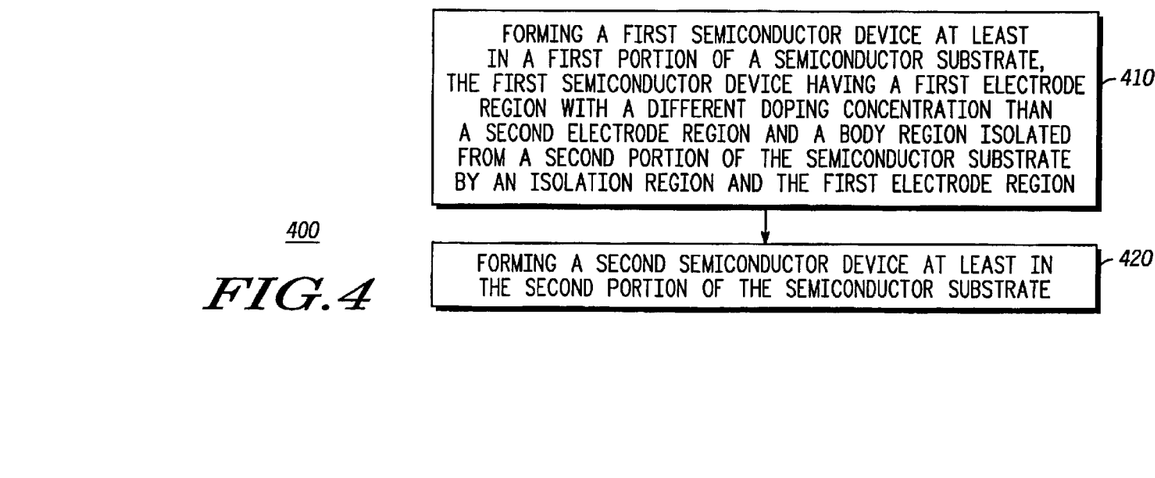
FIG. 4 illustrates a flow chart of a method of manufacturing a semiconductor component in accordance with an embodiment of the present invention.

FIG. 4 illustrates a flow chart 400 of a method of manufacturing a semiconductor component in accordance with an embodiment of the present invention. As an example, the semiconductor component of flow chart 400 in FIG. 4 can be similar to semiconductor component 300 in FIG. 3. At a step 410 of flow chart 400 in FIG. 4, a first semiconductor device is formed at least in a first portion of a semiconductor substrate, and at a step 420 of flow chart 400 in FIG. 4, a second semiconductor device is formed at least in a second portion of the semiconductor substrate. As an example, the semiconductor device of step 410 in FIG. 4 can be similar to semiconductor device 320 in FIG. 3, and the semiconductor device of step 420 in FIG. 4 can be similar to semiconductor device 330 and/or 340 in FIG. 3. In one embodiment of flow chart 400, steps 410 and 420 are performed or occur simultaneously with each other.

As an example, step 410 can further comprise forming a first electrode region, a second electrode region, a body region, and an isolation region in the first portion of the semiconductor substrate. The first electrode region, the second electrode region, the body region, and the isolation region can be similar to electrode region 321, electrode region 322, body region 323, and isolation region 324, respectively, in FIG. 3. While different sequences can be used, the regions that extend deeper into the semiconductor substrate can be formed before the shallower regions.

Furthermore, the first electrode region, the second electrode region, the body region, and the isolation region can each be formed by performing their own chain implants into the first portion of the semiconductor substrate. The chain implants can have different implant doses and different implant energies, but can use the same implant species for a given conductivity type and the same or similar number of implant masks. In fact, in one embodiment, the semiconductor device of step 410 in FIG. 4 and semiconductor device 320 in FIG. 3, as compared to a standard high voltage NMOS platform, only require a single additional implant mask for the second electrode region described above with reference to FIG. 4 or electrode region 322 in FIG. 3. Accordingly, as explained in more detail hereinafter, the chain implants and accompanying implant masks can be used to define the specific shape and varying doping concentrations or profiles of the different regions without significantly increasing the time required to manufacture the semiconductor device.

Furthermore, the chain implants used to form the first electrode region, the second electrode region, the body region, and the isolation region in the semiconductor device of step 410 can use the same or at least similar implant recipes used to form other semiconductor devices (such as, for example, the semiconductor device of step 420) in the semiconductor component. In fact, in one embodiment, the semiconductor device of step 410 in FIG. 4 and semiconductor device 320 in FIG. 3, as compared to a standard high voltage NMOS platform, only require a single additional implant recipe for the optional resurf region in the second electrode region in FIG. 4 or electrode region 322 in FIG. 3. Accordingly, the reuse of the implant processes simplifies the manufacturing process for the semiconductor component and does not significantly increase the time required to manufacture the semiconductor component.

As an example of the above, returning to FIG. 3, electrode region 321 can be formed by using several implant masks— one implant mask for a highly doped, ohmic contact region in electrode region 321 and additional implant masks for the lightly doped region in electrode region 321 that is formed by a chain of implants. The implant mask and the implant recipe for the highly doped, ohmic contact region of electrode region 321 can also be used simultaneously to form all of the other ohmic contact regions of the same conductivity type in semiconductor component 300.

The additional implant masks and the chain of implants for the lightly doped region in electrode region 321 can also be used to simultaneously form other regions in epitaxial layer 312 for other semiconductor devices such as, for example, semiconductor devices 330 and 340. For example, one of the additional implant masks and its accompanying implant recipe can be used to simultaneously form a portion of the lightly doped region of electrode region 321 and also a collector region of a lateral NPN bipolar transistor; a third one of the additional implant masks and its accompanying implant recipe can be used to simultaneously form yet another portion of the lightly doped region of electrode region 321 and also an N-type well region for an isolated resistor; and a fourth one of the additional implant masks and its accompanying implant recipe can be used to simultaneously form still another portion of the lightly doped region of electrode region 321 and also a base region of a PNP bipolar transistor.

Additionally, electrode region 322 can be formed by using several implant masks—one implant mask for a highly doped, ohmic contact region in electrode region 322 and additional implant masks for the lightly doped region in electrode region 322 that is formed by a chain of implants. The highly doped, ohmic contact region of electrode region 322 can be formed by using the same implant mask and implant recipe as that used to form the highly doped, ohmic contact region of electrode region 322. Accordingly, the highly doped, ohmic contact regions of electrode regions 321 and 322 can be formed simultaneously with each other and with all of the other ohmic contact regions of the same conductivity type in semiconductor component 300.

The additional implant masks and the chain of implants for the lightly doped region in electrode region 322 can also be used to simultaneously form other regions in epitaxial layer 312 for other semiconductor devices such as, for example, semiconductor devices 330 and 340. For example, one of the additional implant masks and its accompanying implant recipe can be used to simultaneously form a portion of the lightly doped region of electrode region 322 and also a very thin resurf region or a very thin, lightly doped source and/or drain region for a typical FET in semiconductor component 300; and a second one of the additional implant masks and its accompanying implant recipe can be used to simultaneously form another portion of the lightly doped region of electrode region 322 and also a deeper resurf region or a deeper, lightly doped source and/or drain region for a typical FET in semiconductor component 300.

Furthermore, body region 323 can be formed by using several implant masks—one implant mask for a highly doped, ohmic contact region in body region 323 and additional implant masks for the lightly doped region in body region 323 that is formed by a chain of implants. The implant mask and the implant recipe for the highly doped, ohmic contact region of body region 323 can also be used simultaneously to form all of the other ohmic contact regions of the same conductivity type in semiconductor component 300.

The additional implant masks and the chain of implants for the lightly doped region in body region 323 can also be used to simultaneously form other regions in epitaxial layer 312 for other semiconductor devices such as, for example, semiconductor devices 330 and 340. For example, one of the implant masks and its accompanying implant recipe can be used to simultaneously form a portion of the lightly doped region of body region 323 and also a well region for a high voltage MOSFET; and that same implant mask and a different implant recipe can be used to simultaneously form another portion of the lightly doped region of body region 323 and also a field region for a high voltage MOSFET. In some embodiments of semiconductor device 320, body region 323 may also require a separate implant mask and implant recipe to fine-tune the threshold voltage for the channel region in body region 323.

Moreover, isolation region 324 can be formed by using a single or multiple implant masks in combination with a single or a chain of implants. As an example, an implant mask and its accompanying implant recipe can be used to simultaneously form isolation region 324 and also a deep well region for a bipolar transistor in semiconductor component 300. In general, the regions for the higher voltage devices are implanted with a higher implant energy and a lower implant dose, while the regions for the lower voltage regions are implanted with a lower implant energy and a higher implant dose.

After the epitaxial layer is grown on the substrate, the dielectric isolation regions such as, for example, dielectric isolation regions 351 and 352, are formed. Then, electrode regions 321 and 322, body region 323, and isolation region 324 are formed. Next, dielectric layer 358 is formed. Subsequently, electrode 355 is formed, and then electrodes 353, 354, are 355 are formed simultaneously with each other. After forming an interconnect structure over semiconductor devices 320, 330, and 340, electrode 357 is formed.

Therefore, an improved semiconductor component is provided to overcome the disadvantages of the prior art. The semiconductor component includes an asymmetric, bi-directional transistor integrated into a deep sub-micrometer semiconductor platform having critical dimensions of less than one half of a micrometer. The integration of the transistor is accomplished by adding only a few extra steps and without introducing new process modules in the manufacturing process. The bi-directional nature of the transistor provides flexibility, and the asymmetric nature of the transistor permits a compact size. The compactness of the transistor permits superior high voltage device performance despite being a bi-directional transistor. The high voltage source, drain, and gate isolation can be provided by trench drift and resurf technology. A thicker gate oxide is not needed to support the high gate-to-body or gate-to-substrate voltages.

Although the invention has been described with reference to specific embodiments, it will be understood by those skilled in the art that various changes may be made without departing from the spirit or scope of the invention. For instance, the numerous details set forth herein such as, for example, the doping concentrations and the shapes of certain doped regions are provided to facilitate the understanding of the invention and are not provided to limit the scope of the invention. As another example, in an embodiment where isolation region 324 in FIG. 3 extends into support substrate 311 in FIG. 3, isolation region 324 can be formed before growing or otherwise forming epitaxial layer 312 over support substrate 311. Furthermore, portion 329 of electrode region 321 in FIG. 3 can be eliminated and replaced by isolation region 324. Moreover, isolation region 324 in FIG. 3 can have a stepped profile. Additionally, semiconductor device 320 can be a MESFET.

Accordingly, the disclosure of embodiments of the invention is intended to be illustrative of the scope of the invention and is not intended to be limiting. It is intended that the scope of the invention shall be limited only to the extent required by the appended claims.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Furthermore the terms "comprise," "include," "have," and any variations thereof, are intended to cover a non-exclusive inclusion, such that a process, method, article, or apparatus that comprises a list of elements does not include only those elements, but may include other elements not expressly listed or inherent to such process, method, article, or apparatus.

Moreover, embodiments and limitations disclosed herein are not dedicated to the public under the doctrine of dedication if the embodiments and/or limitations: (1) are not expressly claimed in the claims and (2) are or are potentially equivalents of express elements and/or limitations in the claims under the doctrine of equivalents.

What is claimed is:

1. A semiconductor component comprising:
  a semiconductor substrate having a first conductivity type;
  a first semiconductor device at least in a first portion of the semiconductor substrate; and
  a second semiconductor device at least in a second portion of the semiconductor substrate,
  wherein:
    the first semiconductor device further comprises:
      a first electrode region, a second electrode region, a body region, and an isolation region in the first portion of the semiconductor substrate;
    the body region has the first conductivity type;
    the first electrode region, the second electrode region, and the isolation region have a second conductivity type;
    the second electrode region has a different doping concentration than the first electrode region; and
    the body region is isolated from the second portion of the semiconductor substrate by the isolation region and the first electrode region.

2. The semiconductor component of claim 1 wherein:
  the second electrode region is isolated from the second portion of the semiconductor substrate by the body region.

3. The semiconductor component of claim 1 wherein:
  the first semiconductor device further comprises:
    a drain electrode overlying the first electrode region;
    a source electrode overlying the second electrode region;
    a gate electrode overlying a first portion of the body region; and
    a body electrode overlying a second portion of the body region.

4. The semiconductor component of claim 3 wherein:
  the first semiconductor device further comprises:
    a substrate electrode underlying the isolation region,
  the semiconductor substrate has a first surface and a second surface opposite the second surface;
  the source electrode, the drain electrode, the gate electrode, and the body electrode are adjacent to the first surface of the semiconductor substrate; and the substrate electrode is adjacent to the second surface of the semiconductor substrate.

5. A semiconductor component comprising:
a semiconductor substrate having a first conductivity type;
a first semiconductor device at least in a first portion of the semiconductor substrate; and
a second semiconductor device at least in a second portion of the semiconductor substrate,
wherein:
the first semiconductor device further comprises:
a first electrode region, a second electrode region, a body region, and an isolation region in the first portion of the semiconductor substrate;
the body region has the first conductivity type;
the first electrode region, the second electrode region, and the isolation region have a second conductivity type;
the second electrode region has a different doping concentration than the first electrode region;
the body region is isolated from the second portion of the semiconductor substrate by the isolation region and the first electrode region;
the second electrode region is located between a first portion of the body region and a second portion of the body region;
the second portion of the body region is located between the second electrode region and the first electrode region; and
the first semiconductor device further comprises:
a dielectric isolation region at least partially in the first portion of the semiconductor substrate between the second portion of the body region and the second electrode region.

6. A semiconductor component comprising:
a semiconductor substrate having a first conductivity type;
a first semiconductor device at least in a first portion of the semiconductor substrate; and
a second semiconductor device at least in a second portion of the semiconductor substrate,
wherein:
the first semiconductor device further comprises:
a first electrode region, a second electrode region, a body region, and an isolation region in the first portion of the semiconductor substrate;
the body region has the first conductivity type;
the first electrode region, the second electrode region, and the isolation region have a second conductivity type;
the second electrode region has a different doping concentration than the first electrode region;
the body region is isolated from the second portion of the semiconductor substrate by the isolation region and the first electrode region; and
the first semiconductor device further comprises:
a dielectric isolation region at least partially in the first portion of the semiconductor substrate between a portion of the first electrode region and a first portion of the body region.

7. A semiconductor component comprising:
a semiconductor substrate having a first conductivity type;
a first semiconductor device at least in a first portion of the semiconductor substrate; and
a second semiconductor device at least in a second portion of the semiconductor substrate,
wherein:
the first semiconductor device further comprises:
a first electrode region, a second electrode region, a body region, and an isolation region in the first portion of the semiconductor substrate;
the body region has the first conductivity type;
the first electrode region, the second electrode region, and the isolation region have a second conductivity type;
the second electrode region has a different doping concentration than the first electrode region;
the body region is isolated from the second portion of the semiconductor substrate by the isolation region and the first electrode region;
a first portion of the body region is located between the second electrode region and a first portion of the first electrode region;
the second electrode region is located between the first portion of the body region and a second portion of the body region; and
the second portion of the body region is located between the second electrode region and a second portion of the first electrode region.

8. The semiconductor component of claim 1 wherein:
the semiconductor substrate comprises:
a monocrystalline substrate; and
an epitaxial layer over the monocrystalline substrate; and
the first electrode region, the second electrode region, the body region, and the isolation region are located in the epitaxial layer.

9. A semiconductor component comprising:
a semiconductor substrate having a first conductivity type;
a first semiconductor device at least in a first portion of the semiconductor substrate; and
a second semiconductor device at least in a second portion of the semiconductor substrate,
wherein:
the first semiconductor device further comprises:
a first electrode region, a second electrode region, a body region, and an isolation region in the first portion of the semiconductor substrate;
the body region has the first conductivity type;
the first electrode region, the second electrode region, and the isolation region have a second conductivity type;
the second electrode region has a different doping concentration than the first electrode region;
the body region is isolated from the second portion of the semiconductor substrate by the isolation region and the first electrode region;
the semiconductor substrate comprises:
a monocrystalline substrate; and
an epitaxial layer over the monocrystalline substrate;
the first electrode region, the second electrode region, the body region, and the isolation region are located in the epitaxial layer; and
a portion of the epitaxial layer is located between the isolation region and the monocrystalline substrate.

10. A semiconductor component comprising:
a semiconductor substrate having a first conductivity type;
a first semiconductor device at least in a first portion of the semiconductor substrate; and
a second semiconductor device at least in a second portion of the semiconductor substrate, wherein:
the first semiconductor device further comprises:
a first electrode region, a second electrode region, a body region, and an isolation region in the first portion of the semiconductor substrate;
the body region has the first conductivity type;
the first electrode region, the second electrode region, and the isolation region have a second conductivity type;
the second electrode region has a different doping concentration than the first electrode region;
the body region is isolated from the second portion of the semiconductor substrate by the isolation region and the first electrode region; and
the isolation region is absent underneath a portion of the first electrode region.

11. The semiconductor component of claim 1 wherein: the isolation region is located underneath all of the first electrode region.

12. A semiconductor component comprising:
a semiconductor substrate having a first conductivity type and comprising:
a monocrystalline substrate; and
an epitaxial layer over the monocrystalline substrate;
a MOSFET at least in a first portion of the epitaxial layer; and
a semiconductor device at least in a second portion of the epitaxial layer,
wherein:
the MOSFET further comprises:
a first electrode region, a second electrode region, a body region, and an isolation region in the first portion of the epitaxial layer;
the body region has the first conductivity type;
the first electrode region, the second electrode region, and the isolation region have a second conductivity type;
the second electrode region has a different doping concentration than the first electrode region;
the isolation region and the first electrode region are contiguous with each other;
the second electrode region is isolated from the first electrode region by the body region; and
the body region is isolated from the second portion of the epitaxial layer by the isolation region and the first electrode region.

13. A semiconductor component comprising:
a semiconductor substrate having a first conductivity type and comprising:
a monocrystalline substrate; and
an epitaxial layer over the monocrystalline substrate;
a MOSFET at least in a first portion of the epitaxial layer; and
a semiconductor device at least in a second portion of the epitaxial layer,
wherein:
the MOSFET further comprises:
a first electrode region, a second electrode region, a body region, and an isolation region in the first portion of the epitaxial layer;
the body region has the first conductivity type;
the first electrode region, the second electrode region, and the isolation region have a second conductivity type;
the second electrode region has a different doping concentration than the first electrode region;
the isolation region and the first electrode region are continuous with each other;
the second electrode region is isolated from the first electrode region by the body region;
the body region is isolated from the second portion of the epitaxial layer by the isolation region and the first electrode region; and
the semiconductor component remains operational when the second electrode region is reverse biased relative to the body region.

14. A semiconductor component comprising:
a semiconductor substrate having a first conductivity type and comprising:
a monocrystalline substrate; and
an epitaxial layer over the monocrystalline substrate;
a MOSFET at least in a first portion of the epitaxial layer; and
a semiconductor device at least in a second portion of the epitaxial layer,
wherein:
the MOSFET further comprises:
a first electrode region, a second electrode region, a body region, and an isolation region in the first portion of the epitaxial layer;
the body region has the first conductivity type;
the first electrode region, the second electrode region, and the isolation region have a second conductivity type;
the second electrode region has a different doping concentration than the first electrode region;
the isolation region and the first electrode region are contiguous with each other;
the second electrode region is isolated from the first electrode region by the body region;
the body region is isolated from the second portion of the epitaxial layer by the isolation region and the first electrode region;
the MOSFET is asymmetrical; and
the MOSFET is bi-directional.

15. The semiconductor component of claim 12 wherein:
the second electrode region is isolated from the isolation region by the body region; and
the second electrode region is isolated from the second portion of the epitaxial layer by the body region.

16. The semiconductor component of claim 12 wherein:
the MOSFET further comprises:
a drain electrode overlying the first electrode region;
a source electrode overlying the second electrode region;
a gate electrode overlying a first portion of the body region; and
a body electrode overlying a second portion of the body region; and
the first portion of the body region is a channel region for the MOSFET.

17. A semiconductor component comprising:
a semiconductor substrate having a first conductivity type and comprising:
a monocrystalline substrate; and
an epitaxial layer over the monocrystalline substrate;
a MOSFET at least in a first portion of the epitaxial layer; and
a semiconductor device at least in a second portion of the epitaxial layer, wherein:
the MOSFET further comprises:
a first electrode region, a second electrode region, a body region, and an isolation region in the first portion of the epitaxial layer;
a drain electrode overlying the first electrode region;
a source electrode overlying the second electrode region;
a gate electrode overlying a first portion of the body region; and
a body electrode overlying a second portion of the body region;
the body region has the first conductivity type;
the first electrode region, the second electrode region, and the isolation region have a second conductivity type;
the second electrode region has a different doping concentration than the first electrode region;
the isolation region and the first electrode region are contiguous with each other;
the second electrode region is isolated from the first electrode region by the body region;
the body region is isolated from the second portion of the epitaxial layer by the isolation region and the first electrode region;
the first portion of the body region is a channel region for the MOSFET; and
the MOSFET still further comprises:
a first oxide region at least partially in the first portion of the epitaxial layer between a portion of the first electrode region and the first portion of the body region; and
a second oxide region at least partially in the first portion of the epitaxial layer and between the second portion of the body region and the second electrode region.

18. The semiconductor component of claim 17 wherein:
the MOSFET further comprises:
a substrate electrode underlying the isolation region,
the semiconductor substrate has a first surface and a second surface opposite the second surface;
the source electrode, the drain electrode, the gate electrode, and the body electrode are adjacent to the first surface of the semiconductor substrate; and
the substrate electrode is adjacent to the second surface of the semiconductor substrate.

19. A semiconductor component comprising:
a semiconductor substrate having a first conductivity type and comprising:
a monocrystalline substrate; and
an epitaxial layer over the monocrystalline substrate;
a MOSFET at least in a first portion of the epitaxial layer; and
a semiconductor device at least in a second portion of the epitaxial layer,
wherein:
the MOSFET further comprises:
a first electrode region, a second electrode region, a body region, and an isolation region in the first portion of the epitaxial layer;
the body region has the first conductivity type;
the first electrode region, the second electrode region, and the isolation region have a second conductivity type;
the second electrode region has a different doping concentration than the first electrode region;
the isolation region and the first electrode region are contiguous with each other;
the second electrode region is isolated from the first electrode region by the body region; and
the body region is isolated from the second portion of the epitaxial layer by the isolation region and the first electrode region;
the MOSFET further comprises:
a drain electrode overlying the first electrode region;
a source electrode overlying the second electrode region;
a gate electrode overlying a first portion of the body region; and
a body electrode overlying a second portion of the body region;
the first portion of the body region is a channel region for the MOSFET;
the first portion of the body region is located between the second electrode region and a first portion of the first electrode region;
the second electrode region is located between the first portion of the body region and the second portion of the body region; and
the second portion of the body region is located between the second electrode region and a second portion of the first electrode region.

20. The semiconductor component of claim 19 wherein:
a portion of the epitaxial layer is located between the isolation region and the monocrystalline substrate.

21. The semiconductor component of claim 20 wherein:
the isolation region is absent underneath a portion of the first electrode region.

22. The semiconductor component of claim 20 wherein:
the isolation region is located underneath all of the first electrode region.

23. A method of manufacturing a semiconductor component comprising:
forming a first semiconductor device at least in a first portion of a semiconductor substrate; and
forming a second semiconductor device at least in a second portion of the semiconductor substrate,
wherein:
forming the first semiconductor device and forming the second semiconductor device occur simultaneously with each other;
forming the first semiconductor device further comprises:
forming a first electrode region, a second electrode region, a body region, and an isolation region in the first portion of the semiconductor substrate;
the body region has a first conductivity type;
the first electrode region, the second electrode region, and the isolation region have a second conductivity type;
the second electrode region has a different doping concentration than the first electrode region; and
the body region is isolated from the second portion of the semiconductor substrate by the isolation region and the first electrode region.

24. The method of claim 23 wherein:
forming the first electrode region, the second electrode region, the body region, and the isolation region further comprises:
performing chain implants into the first portion of the semiconductor substrate to form the first electrode region.

25. The method of claim 23 wherein:

forming the first electrode region, the second electrode region, the body region, and the isolation region further comprises:

performing chain implants into the first portion of the semiconductor substrate to form the second electrode region.

26. The method of claim 23 wherein:

forming the first electrode region, the second electrode region, the body region, and the isolation region further comprises:

performing chain implants into the first portion of the semiconductor substrate to form the body region.

27. The method of claim 23 wherein:

forming the first electrode region, the second electrode region, the body region, and the isolation region further comprises:

forming the first electrode region and the second electrode region in separate steps.

* * * * *